(12) United States Patent
Nam et al.

(10) Patent No.: US 7,642,148 B2
(45) Date of Patent: Jan. 5, 2010

(54) METHODS OF PRODUCING SEMICONDUCTOR DEVICES INCLUDING MULTIPLE STRESS FILMS IN INTERFACE AREA

(75) Inventors: Seo-woo Nam, Yongin-si (KR); Ki-chul Kim, Suwon-si (KR); Young-joon Moon, Seoul (KR); Jae-ouk Choo, Yongin-si (KR); Hong-jae Shin, Seoul (KR); Nae-in Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/851,500

(22) Filed: Sep. 7, 2007

(65) Prior Publication Data

US 2008/0079087 A1 Apr. 3, 2008

(30) Foreign Application Priority Data

Sep. 28, 2006 (KR) .................... 10-2006-0095117

(51) Int. Cl.
*H01L 21/8238* (2006.01)
(52) U.S. Cl. ............... 438/200; 257/369; 257/E21.632; 257/E29.255; 438/218
(58) Field of Classification Search ............. 257/369, 257/E21.632; 438/200, 218
See application file for complete search history.

(56) References Cited

U.S. PATENT DOCUMENTS

| 6,372,569 | B1 | 4/2002 | Lee et al. |
| 2005/0093030 | A1 | 5/2005 | Doris et al. |
| 2005/0156199 | A1 | 7/2005 | Ko et al. |
| 2006/0094193 | A1 | 5/2006 | Horstmann et al. |

(Continued)

FOREIGN PATENT DOCUMENTS

JP    2001-298022 A    10/2001

(Continued)

OTHER PUBLICATIONS

Notice of Allowance, KR 10-2006-0095117, Sep. 10, 2007.

*Primary Examiner*—David Vu
*Assistant Examiner*—Brandon Fox
(74) *Attorney, Agent, or Firm*—Myers Bigel Sibley & Sajovec (57) ABSTRACT

A semiconductor substrate includes a first transistor area having a first gate electrode and first source/drain areas, a second transistor area having a second gate electrode and second source/drain areas, and an interface area provided at an interface of the first transistor area and the second transistor area and having a third gate electrode. A first stress film is on the first gate electrode and the first source/drain areas of the first transistor area and at least a portion of the third gate electrode of the interface area. A second stress film is on the second gate electrode and the second source/drain areas of the second transistor area and not overlapping the first stress film on the third gate electrode of the interface area or overlapping at least a portion of the first stress film. The second stress film overlapping at least the portion of the first stress film is thinner than the second stress film in the second transistor area. Related methods are also described.

11 Claims, 8 Drawing Sheets

U.S. PATENT DOCUMENTS

| | | | |
|---|---|---|---|
| 2007/0063286 A1* | 3/2007 | Kotani | 257/365 |
| 2007/0200179 A1* | 8/2007 | Chen | 257/369 |
| 2008/0050869 A1* | 2/2008 | Sudo | 438/228 |
| 2008/0054413 A1* | 3/2008 | Dyer et al. | 257/635 |
| 2009/0014807 A1* | 1/2009 | Tang et al. | 257/369 |
| 2009/0017630 A1* | 1/2009 | Lee et al. | 438/702 |

FOREIGN PATENT DOCUMENTS

| | | |
|---|---|---|
| KR | 2001-0058344 A | 7/2001 |
| KR | 10-2005-0076256 A | 7/2005 |

* cited by examiner

METHODS OF PRODUCING SEMICONDUCTOR DEVICES INCLUDING MULTIPLE STRESS FILMS IN INTERFACE AREA

CROSS-REFERENCE TO RELATED APPLICATION

This application claims the benefit under 35 USC §119 of Korean Patent Application No. 10-2006-0095117, filed on Sep. 28, 2006, the disclosure of which is hereby incorporated herein by reference in its entirety as if set forth fully herein.

FIELD OF THE INVENTION

The present invention relates to semiconductor devices and methods of producing the same and, more particularly, to semiconductor devices including stress films and methods of producing the same.

BACKGROUND OF THE INVENTION

As the integration density and/or speed of metal oxide semiconductor field effect transistors (MOSFETs) has continued to increase, various processes have been studied to try increase the performance and/or reliability of the transistors. Particularly, many processes have been developed to try increase mobility of electrons or holes in order to produce high-performance transistors.

A process of applying physical stress to a channel area to change an energy band structure of the channel area may be performed to increase the mobility of the electrons or the holes. For example, NMOS transistors may have improved performance in the case of when tensile stress is applied to a channel, and PMOS transistors may have improved performance in the case of when compressive stress is applied to a channel. Accordingly, a dual stress film structure has been proposed where a tensile stress film is formed on the NMOS transistors and a compressive stress film is formed on the PMOS transistors, to allow improved performances of both the NMOS transistors and the PMOS transistors.

SUMMARY OF THE INVENTION

Some embodiments of the present invention provide semiconductor devices including a semiconductor substrate that includes a first transistor area having a first gate electrode and first source/drain areas, a second transistor area having a second gate electrode and second source/drain areas, and an interface area provided at an interface of the first transistor area and the second transistor area and having a third gate electrode. A first stress film is on the first gate electrode and the first source/drain areas of the first transistor area and on at least a portion of the third gate electrode of the interface area. A second stress film is on the second gate electrode and the second source/drain areas of the second transistor area and on at least a portion of the third gate electrode of the interface area and not overlapping the first stress film on the third gate electrode of the interface area or overlapping at least a portion of the first stress film. The second stress film overlapping at least the portion of the first stress film is thinner than the second stress film in the second transistor area.

Other embodiments of the present invention provide methods of producing a semiconductor device that include forming a first stress film on a first gate electrode and first source/drain areas of a first transistor area of a semiconductor substrate and on at least a portion of a third gate electrode of an interface area between the first transistor area and a second transistor area and forming a second stress film on a second gate electrode and second source/drain areas of the second transistor area of the semiconductor substrate and overlapping at least a portion of the first stress film on the third gate electrode of the interface area. A first interlayer insulating film is formed on the first stress film and the second stress film. The first interlayer insulating film is planarized to expose the second stress film overlapping at least a portion of the first stress film on the third gate electrode. At least a portion of the exposed second stress film is removed, and a second interlayer insulating film is formed on the first interlayer insulating film.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes," "including," "have" and/or "having" when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the invention may arise from recognition that when a dual stress film is applied, an area where the tensile stress film and the compressive stress film partially overlap may be formed at the interface of the NMOS transistor and the PMOS transistor according to characteristics of devices and/or photolithography margins. The overlapping area of the stress film is generally thicker than the area where the single stress film is layered. Therefore, in the case of when contact holes are formed through the single stress film and the overlapping area using an etching process, the contact holes are first formed through the single stress film, and a lower structure of the contact holes which are formed beforehand may be attacked before the contact holes are formed through the overlapping area. Accordingly, contact characteristics and/or reliability of the semiconductor device may be reduced. Embodiments of the invention provide devices and methods that can reduce or eliminate this overlap of the first and second stress films.

Hereinafter, a description will be given of semiconductor devices according to embodiments of the present invention with reference to the accompanying drawings.

Figure 1A:
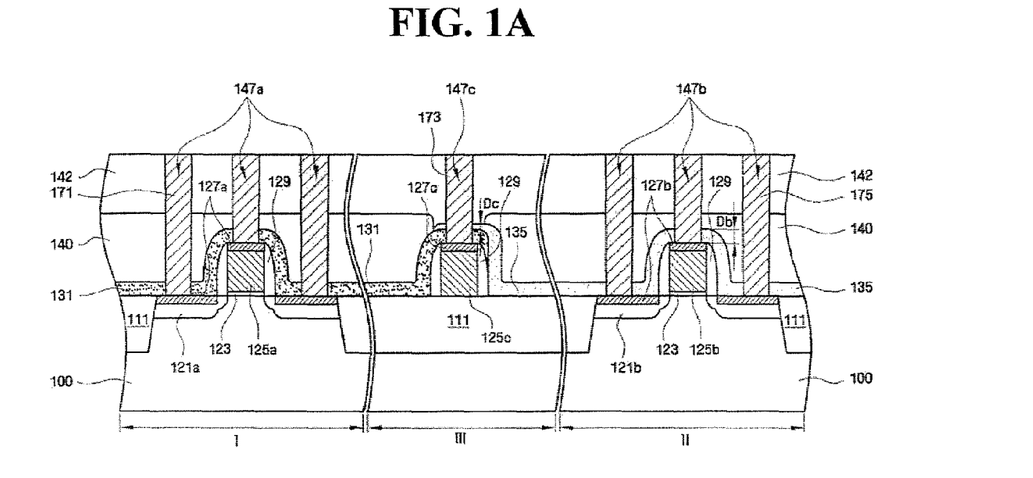
FIG. 1A is a cross-sectional view of a semiconductor device according to various embodiments of the present invention.

FIG. 1A is a cross-sectional view of a semiconductor device that is produced using methods according to various embodiments of the present invention. With reference to FIG. 1A, a semiconductor device includes a plurality of transistors that are formed on a semiconductor substrate 100. The semiconductor substrate 100 may be divided into at least three areas, for example, an NMOS transistor area (I), a PMOS transistor area (II), and an interface area (III).

The semiconductor substrate 100 is included in the NMOS transistor area (I), the PMOS transistor area (II), and the interface area (III). The semiconductor substrate 100 may comprise a single monolithic substrate including the different areas. The semiconductor substrate 100 may be made of, for example, Si, Ge, SiGe, GaP, GaAs, SiC, SiGeC, InAs and/or InP. Moreover, the semiconductor substrate 100 may be a laminated substrate where at least two layers including a semiconductor substance layer formed of the above-mentioned substances and an insulating layer are layered. Examples of the semiconductor substrate may include an SOI (Semiconductor On Insulator) substrate. An element isolation film 111 that defines an active area is formed in the semiconductor substrate 100. Furthermore, a P-type well may be formed in the semiconductor substrate 100 of the NMOS transistor area (I) and a N-type well may be formed in the semiconductor substrate 100 of the PMOS transistor area (II), which are not shown for clarity.

The NMOS transistor which is formed in the NMOS transistor area (I) and the PMOS transistor which is formed in the PMOS transistor area (II) include gate electrodes 125a and 125b on the semiconductor substrate 100 so that gate insulating films 123 are interposed between the gate electrodes and the semiconductor substrate. Source/drain areas 121a and 121b are provided in the semiconductor substrate 100 so that the source/drain areas face each other while the gate electrodes 125a and 125b are provided between the source/drain areas. Channel areas are provided between the source/drain areas 121a and 121b facing each other and overlapping lower portions of the gate electrodes 125a and 125b.

The gate electrodes 125a and 125b may be a single film formed of, for example, a polysilicon film, a metal film, or a metal silicide film, or a laminated film thereof. In the polysilicon film, for example, an N-type impurity is doped into the NMOS transistor area (I) and a P-type impurity is doped into the PMOS transistor area (II). However, the polysilicon film is not limited to the above-mentioned structure. The conductivity types of impurity doped into the areas of the polysilicon film may be reversed as compared to the above-mentioned structure, or the areas may have the same conductivity type. Examples of metal components constituting the metal film or the silicide film may include tungsten (W), cobalt (Co), nickel (Ni), titanium (Ti) and/or tantalum (Ta). However, hereinafter, only a description of the gate electrodes 125a and 125b that include the polysilicon film and the silicide films 127a and 127b formed on the polysilicon film will be given, for the sake of simplicity.

The gate insulating films 123 are interposed between the semiconductor substrate 100 and the gate electrodes 125a and 125b. The gate insulating films 123 may be formed of, for example, a silicon oxide film. However, a film constituting the gate insulating film is not limited to the silicon oxide film, but another high dielectric insulating film and/or low dielectric insulating film may be used if necessary. Multilayer gate insulating films 123 also may be provided.

Spacers 129 are formed on walls (sidewalls) of the gate electrodes 125a and 125b and the gate insulating films 123. The spacers are formed of, for example, a silicon nitride film.

The source/drain areas 121a and 121b may include an LDD (lightly doped drain) area that overlaps the spacers 129 and a high-concentration doping area that does not overlap the spacers 129. In the NMOS transistor area (I), the N-type impurity is doped into the LDD area at a low concentration, and the N-type impurity is doped into the high-concentration doping area at a high concentration. In the PMOS transistor area (II), the P-type impurity is doped into the LDD area at a low concentration, and the P-type impurity is doped into the high-concentration doping area at a high concentration. In modified embodiments of the present invention which is not shown, a DDD (double diffused drain) area may be provided instead of the LDD area.

The source/drain areas 121a and 121b may include the silicide films 127a and 127b that are identical or similar to the silicide films formed on upper parts of the gate electrodes 125a and 125b. In the specification, the silicide films 127a and 127b are divided for the convenience of description. That is, the silicide films 127a and 127b included in the source/drain areas 121a and 121b and the silicide films 127a and 127b included in the gate electrodes 125a and 125b are designated by the same reference numeral if they are provided in the same area. However, substances constituting the films may be different from each other or the same as each other.

Meanwhile, a gate electrode 125c and a spacer 129 that have substantially the same structure as those of the NMOS transistor area (I) and the PMOS transistor area (II) are provided in the interface area (III). Accordingly, an upper part of the gate electrode 125c of the interface area (III) may include a silicide film 127c. The gate electrode 125c of the interface area (III) may be provided on the element isolation film 111. In this case, as shown in FIG. 1, the gate insulating film 123 may be omitted. However, a gate insulating film may also be present. Meanwhile, in other embodiments, the gate electrode 125c of the interface area (III) may be formed on the active area. In this case, the gate electrode 125c may constitute a portion of the NMOS transistor or the PMOS transistor.

A first stress film 131 and/or a second stress film 135 are provided on the above-mentioned gate electrodes 125a, 125b, and 125c of the NMOS transistor area (I), the PMOS transistor area (II), and the interface area (III).

In detail, the first stress film 131 having tensile stress is provided in the NMOS transistor area (I), and the second stress film 135 having compressive stress is provided in the PMOS transistor area (II). The first stress film 131 and the second stress film 135 may be formed of, for example, SiN, SiON, SiBN, SiC, SiC:H, SiCOH, SiCN and/or $SiO_2$, and each may have a thickness in the range of about 1 to about 1,000 Å. In some embodiments, the first stress film 131 and the second stress film 135 may be substantially the same as each other in terms of thickness.

The stress of the first stress film 131 and the second stress film 135 may be controlled depending on a composition ratio of substances constituting the films and/or formation conditions of the substances. For example, the first stress film 131 may have tensile stress of about 0.01 to about 5 GPa, and the second stress film 135 may have compressive stress of about −0.01 to about −5 GPa.

The first stress film 131 and the second stress film 135 apply stress to the channel area so as to increase mobility of carriers. That is, the first stress film 131 is on, and in some embodiments covers, the gate electrode 125a and the source/drain areas 121a of the NMOS transistor to apply tensile stress to the channel area, thereby increasing mobility of the electron carriers. The second stress film 135 is on, and in some embodiments covers, the gate electrode 125b and the source/drain areas 121b of the PMOS transistor to apply compressive stress to the channel area, thereby increasing mobility of the hole carriers.

Meanwhile, the first stress film 131 and the second stress film 135 meet each other in the interface area (III). The area where the first stress film 131 and the second stress film 135 partially overlap while the contact hole 147c formed on the gate electrode 125c is provided between the first stress film and the second stress film may be included in the interface area according to the process margin. However, the thickness (Dc) of the second stress film 135 in the area where the first stress film 131 and the second stress film 135 partially overlap may be smaller than the thickness of (Db) in the second transistor area.

Since the second stress film 135 is relatively thin in the area where the first stress film 131 and the second stress film 135 partially overlap, the level of the second stress film 135 in the area where the first stress film 131 and the second stress film 135 partially overlap may be substantially similar to the level of the first stress film 131 on the gate electrode 125a of the first transistor area (I) or the level of the second stress film 135 on the gate electrode 125b of the second transistor area (II). In connection with this, the term "level" means the height or distance from the semiconductor substrate 100.

FIG. 1A illustrates that the first stress film 131 is provided tinder the second stress film 135 in the overlapping area. Hereinafter, a description will be given on the assumption that the first stress film 131 is provided under the second stress film 135 in the overlapping area. However, the order of layering may be changed.

A first interlayer insulating film 140 is provided on the first stress film 131 and on the second stress film 135. That is, the first interlayer insulating film 140 may be provided so that the interlayer insulating film is not divided into the NMOS transistor area (I), the PMOS transistor area (II), and the interface area (III).

The first interlayer insulating film 140 and a second interlayer insulating film 142 are provided on the first stress film 131 and the second stress film 135. The upper side of the first interlayer insulating film 140, that is, the interface between the first interlayer insulating film 140 and the second interlayer insulating film 142, can be flat, and has a level that is about the same as that of the highest upper side (furthest from the substrate) of the upper sides of the first stress film 131 and the second stress film 135 provided on the upper sides of the gate electrodes 125a, 125b, and 125c.

The first and the second interlayer insulating films 140 and 142 may be formed of, for example, TEOS (tetra ethyl ortho silicate), $O_3$-TEOS, USG (undoped silicate glass), PSG (phosphosilicate glass), BSG (borosilicate glass), BPSG (borophosphosilicate glass), FSG (fluoride silicate glass), SOG (spin on glass) and/or TOSZ (tonen silazene). The first interlayer insulating film 140 and the second interlayer insulating film 142 may be formed of the same material.

Contact holes 147a, 147b, and 147c are provided in the interlayer insulating films 140 and 142, the first stress film 131, and the second stress film 135 to expose the gate electrodes 125a, 125b, and 125c and/or the source/drain areas 121a and 121b. In detail, the contact hole 147a may be formed through the interlayer insulating film 140 and the first stress film 131 in the NMOS transistor area (I). The second contact hole 147b may be formed through the interlayer insulating film 140 and the second stress film 135 in the PMOS transistor area (II). The third contact hole 147c may be formed through the interlayer insulating film 140, the second stress film 135, and the first stress film 131 in the interface area (III). The thickness (Dc) of the second stress film 135 through which the third contact hole 147c is formed may be smaller than the thickness (Db) of the second stress film 135 of the second transistor area (II) through which the second contact hole 147b is formed.

Contact plugs 171, 173, and 175 are in, and in some embodiments may fill, the contact holes 147a, 147b, and 147c. The contact plugs 171, 173, and 175 are electrically connected to the gate electrodes 125a, 125b, and 125c or the source/drain areas 121a and 121b. The contact plugs 171, 173, and 175 may be made of a metal substance such as W, Cu and/or Al, and/or a conductive substance such as conductive polysilicon.

Figure 1B:
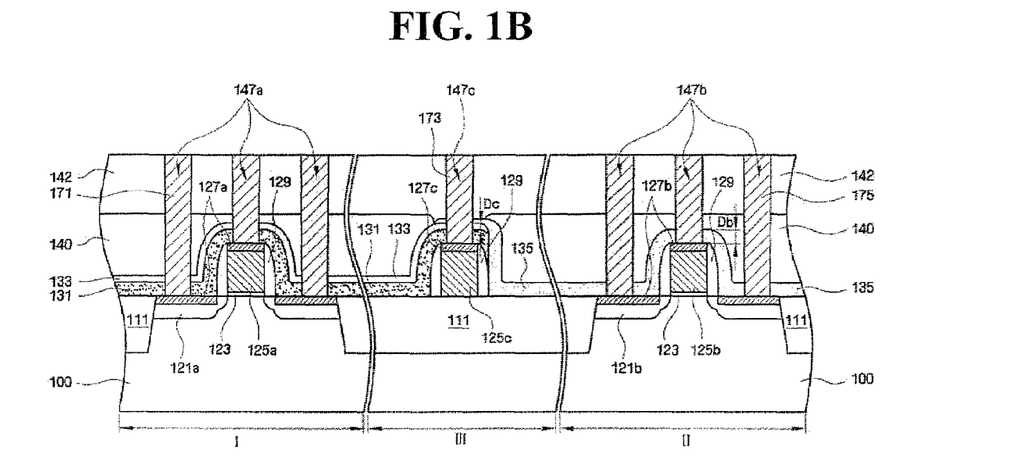
FIG. 1B is a cross-sectional view of a semiconductor device according to other embodiments of the present invention.

FIG. 1B is a cross-sectional view of a semiconductor device according to other embodiments of the present invention. In the present embodiments, a description may be omitted or briefly given of the same structure as the embodiment of FIG. 1A, and a difference in the embodiments will be mainly described.

With reference to FIG. 1B, a semiconductor device according to the present embodiments is different from that of the embodiments of FIG. 1A in that an etch stop film 133 is further provided on the first stress film 131. The etch stop film 133 may be formed of a silicon oxide film, and/or an LTO (low temperature oxide) film.

The interface area (III) may include the area where the first stress film 131 and the second stress film 135 partially overlap, and the etch stop film 133 may be interposed between the first stress film and the second stress film in this interface area. Meanwhile, the overlapping area where the etch stop film 133 is provided on the first stress film 131 is shown in FIG. 1B, and the structure having the overlapping area will be described. However, the etch stop film 133 may be provided on the second stress film 135. In this case, the order of layering of the first stress film 131 and the second stress film 135 may be changed. Additionally, modifications of the present embodiments may include the etch stop film 133 formed on both the first stress film 131 and the second stress film 135.

In the case of when the etch stop film 133 is formed on the first stress film 131, the first interlayer insulating film 140 is formed on the etch stop film 133 and the second stress film 135. The second interlayer insulating film 142 may be formed on the first interlayer insulating film 140.

In the case of when the etch stop film 133 is formed, the first contact hole 147a may be formed through the first and the second interlayer insulating films 140 and 142, the etch stop film 133, and the first stress film 131. The third contact hole 147c may be formed through the first and the second interlayer insulating films 140 and 142, the second stress film 135, the etch stop film 133, and the first stress film 131. However, the thickness (Dc) of the second stress film 135 through which the third contact hole 147c is formed is smaller than the thickness (Db) in the second transistor area.

Figure 1C:
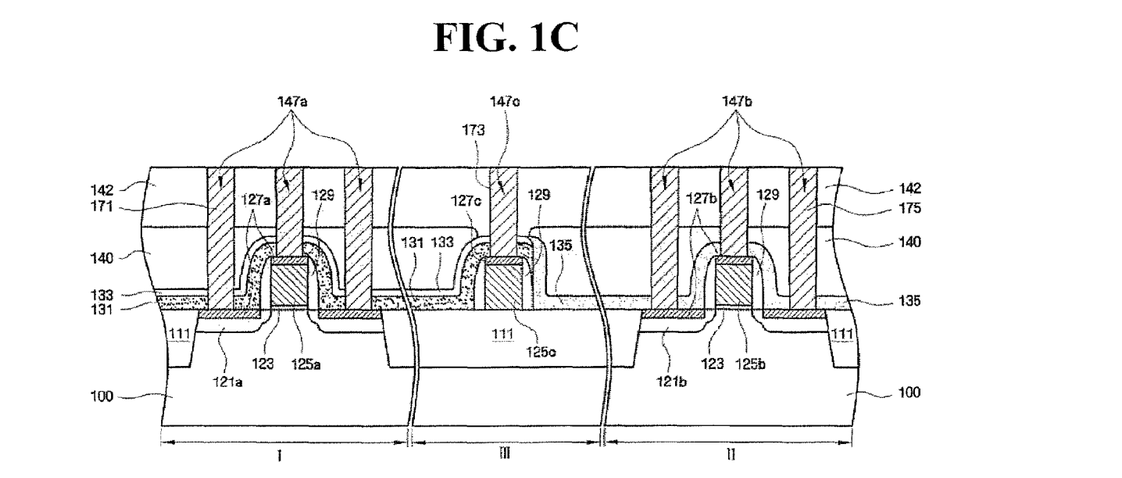
FIG. 1C is a cross-sectional view of a semiconductor device according to yet other embodiments of the present invention.

FIG. 1C is a cross-sectional view of a semiconductor device according to other embodiments of the present invention. In the present embodiments, a description may be omitted or briefly given of the same structure as the embodiment of FIG. 1A, and a difference in embodiments will be mainly described.

With reference to FIG. 1C, a semiconductor device according to the present embodiments is different from those of the embodiments of FIGS. 1A and 1B in that the second stress film 135 does not overlap the third gate electrode 125c. Rather, the second stress film 135 abuts against the first stress film 131 in the interface area (III). In the case of when the second stress film 135 does not overlap the third gate electrode 125c and the etch stop film 133 is formed on the third gate electrode 125c, the etch stop film 133 is exposed to the second interlayer insulating film 142. In the case of when the etch stop film 133 is not formed, the first stress film 131 is exposed. This is not shown for clarity.

As shown in FIG. 1C, since the second stress film 135 does not overlap the third gate electrode 125c, the level of the etch stop film 133 on the third gate electrode 125c may be substantially similar to the level of the first stress film 131 on the gate electrode 125a of the first transistor area (I) or the level of the second stress film 135 on the gate electrode 125b of the second transistor area (II).

The first contact hole 147a may be formed through the first and the second interlayer insulating films 140 and 142, the etch stop film 133, and the first stress film 131 in the NMOS transistor area (I), and the second contact hole 147b may be formed through the first and the second interlayer insulating films 140 and 142, and the second stress film 135 in the PMOS transistor area (II). The third contact hole 147c may be formed through the first and the second interlayer insulating films 140 and 142, the etch stop film 133, and the first stress film 131. This may be different from the case of when the third contact hole 147c is formed through the second stress film 135 in FIG. 1A.

Hereinafter, a description will be given of methods of producing the above-mentioned semiconductor devices.

FIGS. 2 to 17 are cross-sectional views of intermediate structures at steps of methods of producing semiconductor devices, and devices so produced, according to the embodiments of the present invention shown in FIG. 1A.

Figure 2:
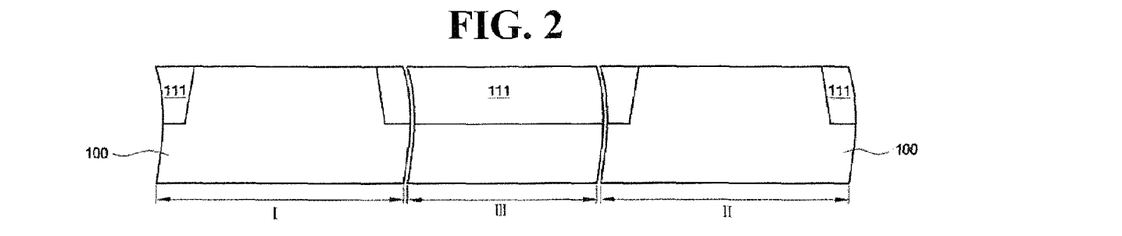
FIGS. 2 to 17 are cross-sectional views sequentially illustrating methods of producing semiconductor devices and devices so produced according to various embodiments of the present invention.

With reference to FIG. 2, the semiconductor substrate 100 is divided into the NMOS transistor area (I), the PMOS transistor area (II), and the interface area (III), and the element isolation films 111 are formed in the areas to define active areas. The element isolation films 111 may be formed of, for example, a silicon oxide film, and the formation may be performed using a LOCOS (local oxidation of silicon) process and/or an STI (shallow trench isolation) process. Since various types of methods of forming the element isolation films 111 are known to those skilled in the art, a detailed description thereof will be omitted.

Meanwhile, the cross-sectional view of FIG. 2 shows the formation of only the element isolation film 111 in the interface area (III). However, only the active area may be formed in the interface area (III), or both the element isolation film 111 and the active area may be formed in the interface area (III).

Additionally, before and/or after the element isolation films 111 are formed, the NMOS transistor area (I) of the semiconductor substrate 100 may include the p-type impurity doped at a low concentration, and the PMOS transistor area (II) of the semiconductor substrate 100 may include the n-type impurity doped at a low concentration, which are not shown. For example, in the case of when a P-type substrate is used as the semiconductor substrate 100, the n-type impurity may be doped into the PMOS transistor area (II) to form an n-well. In the case of when the P-type substrate is used as the base substrate, the p-type impurity may be doped into the NMOS transistor area (I) to form a p-well, but this is not done in other embodiments.

Figure 3:
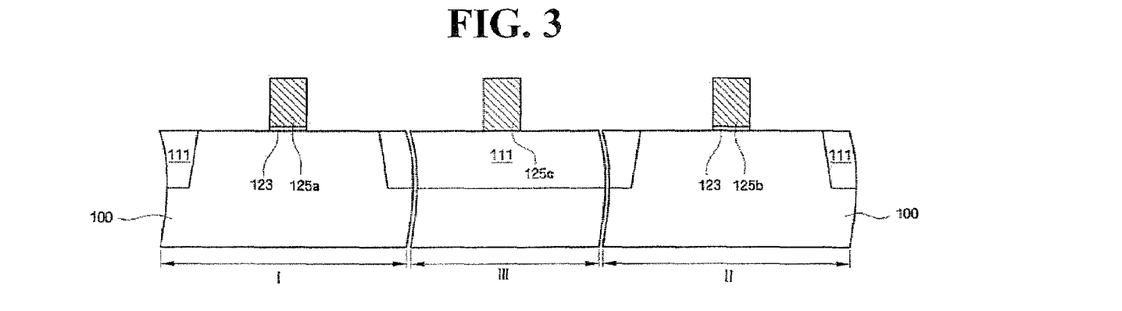

With reference to FIG. 3, an insulating substance and a conductive substance are applied to a front surface of the semiconductor substrate 100.

The insulating substance layer may be, for example, a silicon oxide film. The application may be performed by a thermal oxidation process, chemical vapor deposition (CVD), low pressure chemical vapor deposition (LPCVD) and/or plasma enhanced chemical vapor deposition (PECVD).

The conductive substance may be, for example, polysilicon and/or metal into which n-type or p-type impurity is doped. The application may be performed by low pressure CVD (LPCVD), atomic layer deposition (ALD), physical vapor deposition (PVD) and/or metal organic CVD (MOCVD). Hereinafter, the case of when polysilicon is used as the conductive substance will be described.

The conductive substance layer and the insulating substance layer are patterned to form the gate electrodes 125a, 125b, and 125c, and the gate insulating film 123.

Figure 4:
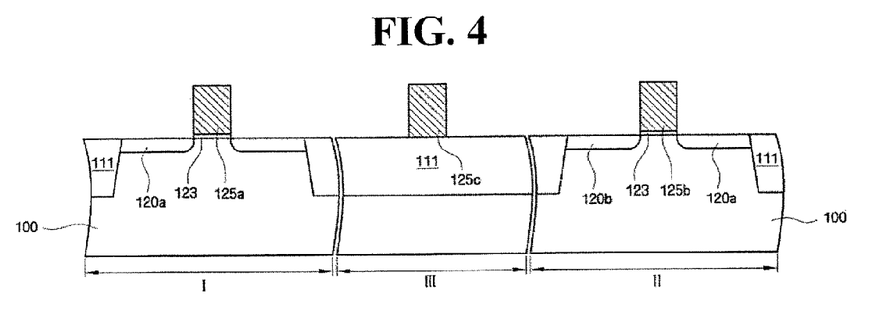

Subsequently, the source/drain areas are formed in the active areas of the semiconductor substrate 100, and the silicide films are formed on the upper sides of the gate electrodes 125a, 125b, and 125c and the source/drain areas. FIGS. 4 to 7 illustrate the formation of the source/drain areas and the silicide films. With reference to FIG. 4, the low concentration n-type impurity (see reference numeral 120a) is doped into the active area of the NMOS transistor area (I), and the low concentration p-type impurity (see reference numeral 120b) is doped into the active area of the PMOS transistor area (II). For example, when the low concentration n-type impurity is doped, a photoresist film covers the PMOS transistor area (II) to dope the n-type impurity into only the NMOS transistor area (I). When the low concentration p-type impurity is doped, the photoresist film covers the NMOS transistor area (II) to dope the p-type impurity into only the PMOS transistor area (I).

Figure 5:
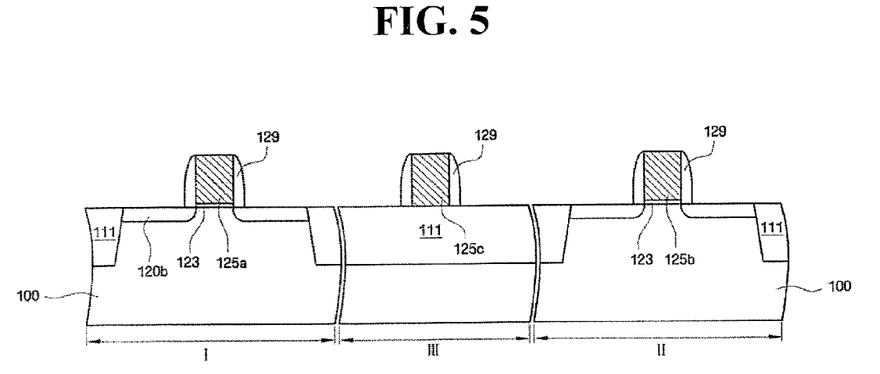

With reference to FIG. 5, the spacers 129 are formed on walls of the gate electrodes 125a, 125b, and 125c, and the gate insulating films 123. The spacers 129 may be formed of, for example, a silicon nitride film. The silicon nitride film may be layered on a front side of the semiconductor substrate 100 and an etch back process may be performed to form the spacers 129. In the drawing, the spacers 129 are arranged so that the upper side of the gate electrode is exposed and the upper sides of the spacers 129 are on the same horizontal plane as the upper sides of the gate electrodes 125a, 125b, and 125c. Hereinafter, the above-mentioned structure will be described. However, the spacer 129 may be recessed so that the upper side of the spacer is lower than the upper sides of the gate electrodes 125a, 125b, and 125c which may facilitate forming the silicide film. Alternatively, the spacer 129 may be formed so as to at least partially cover the upper sides of the gate electrodes 125a, 125b, and 125c.

Figure 6:
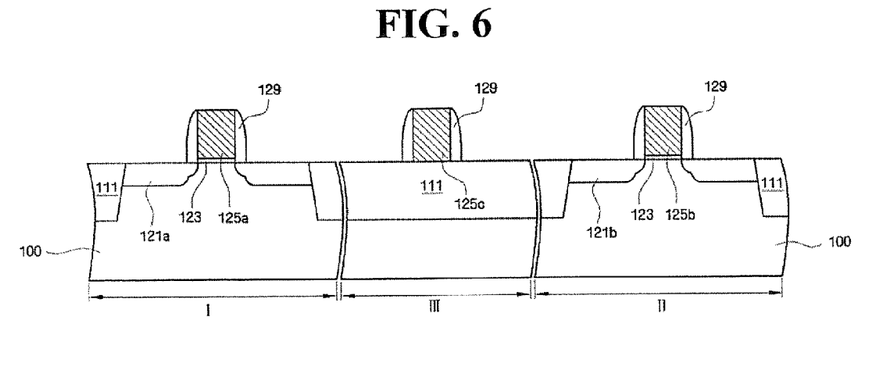

With reference to FIG. 6, the high concentration n-type impurity is doped into the active area of the NMOS transistor area (I), and the high concentration p-type impurity is doped into the active area of the PMOS transistor area (II). In detail, when the high concentration n-type impurity is doped, the photoresist film covers the PMOS transistor area (II) and the gate electrodes 125a, 125b, and 125c and the spacer 129 are doped using a doping mask, thereby doping the high concentration n-type impurity into only the exposed active area of the NMOS transistor area (I). Additionally, when the high concentration p-type impurity is doped, the photoresist film covers the NMOS transistor area (I) and the gate electrodes 125a, 125b, and 125c and the spacer 129 are doped using the doping mask, thereby doping the high concentration p-type impurity into only the PMOS transistor area (II). As a result, the source/drain areas 121a and 121b including the high concentration doping area and the low concentration doping area are produced.

Figure 7:
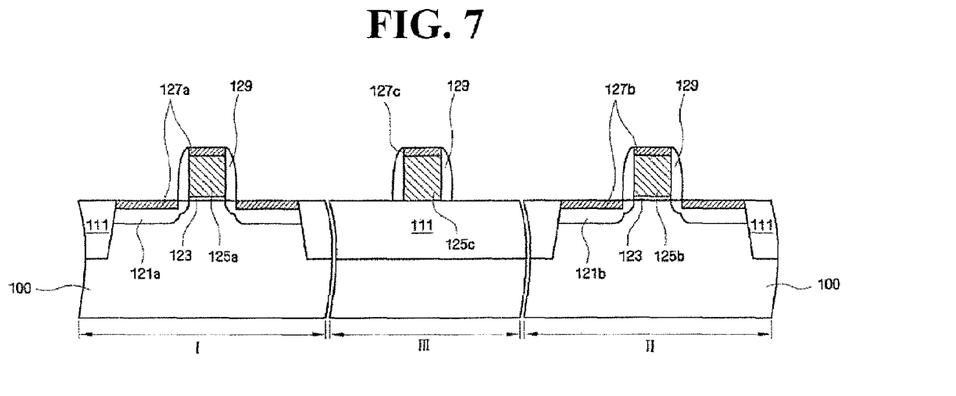

With reference to FIG. 7, the upper sides of the gate electrodes 125a, 125b, and 125c and the exposed upper sides of the source/drain areas 121a and 121b are subjected to silicidation. A metal film for silicidation, for example, metal such as tungsten (W), cobalt (Co), nickel (Ni), titanium (Ti), and/or tantalum (Ta), may be applied to the front side of the semiconductor substrate 100 and then subjected to heat treatment to perform the silicidation. For example, in the case of when the gate electrodes 125a, 125b, and 125c are formed of polysilicon, the upper sides of the source/drain areas 121a and 121b and the upper sides of the gate electrodes 125a, 125b, and 125c may be silicidated by the heat treatment of the semiconductor substrate 100. Subsequently, the metal film for silicidation that is not silicidated on the semiconductor substrate 100 may be removed to form the self-aligned silicide films 127a, 127b, and 127c on the upper sides of the gate electrodes 125a, 125b, and 125c and the exposed upper sides of the source/drain areas 121a and 121b.

Subsequently, the first stress film 131 is formed in the NMOS transistor area (I), and the second stress film 135 is formed in the PMOS transistor area (II). In connection with this, the first stress film 131 and the second stress film 135 are set to partially overlap each other in the interface area (III) in consideration of the process margin. More specific processes are shown in FIGS. 8 to 11.

Figure 8:
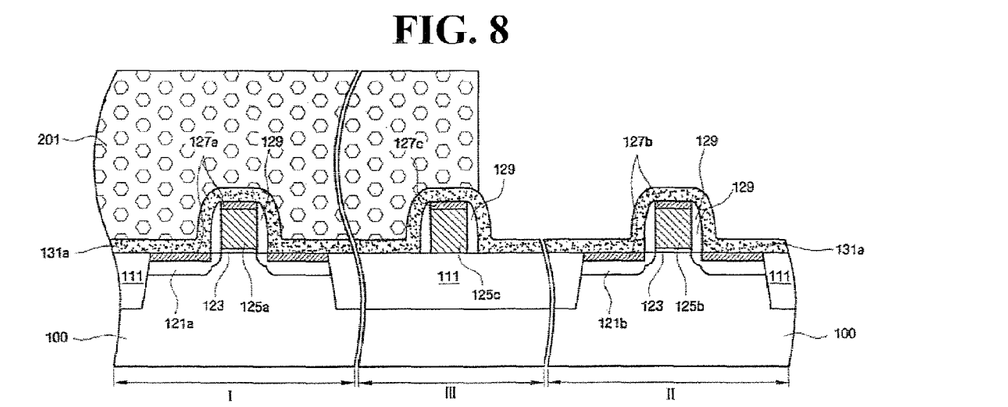

With reference to FIG. 8, a layer for a first stress film 131a is formed on the front side of the resulting structure of FIG. 7. The layer for a first stress film 131a may be, for example, a tensile stress film. The layer for a first stress film 131a may be formed of, for example, SiN, SiON, SiBN, SiC, SiC:H, SiCOH, SiCN and/or $SiO_2$. The layer for a first stress film 131a may have a thickness in the range of about 1 to about 1,000 Å, and may be formed by CVD (chemical vapor deposition), thermal CVD, PECVD (plasma enhanced CVD) and/or high density plasma CVD. For example, the layer for a first stress film 131a made of SiN may be formed by a silicon source gas such as $SiH_4$ and a nitrogen source gas such as $NH_3$ and/or $N_2$ at a temperature of about 300 to about 600° C. and a pressure of about 1 to about 10 torr. Tensile stress of the layer for a first stress film 131a may be controlled using a deposition condition or a composition ratio of substances constituting the film. For example, the stress may be controlled to the range of about 0.01 to about 5 GPa.

Subsequently, a first photoresist pattern 201 is formed on the layer for a first stress film 131a. The first photoresist pattern 201 may cover the entire surface of the NMOS transistor area (I) while the PMOS transistor area (II) is exposed. Additionally, the first photoresist pattern 201 may be formed to cover a portion of the gate electrode 125c of the interface area (III), and in some embodiments the entire gate electrode, so as to provide the process margin, that is, to completely cover the entire NMOS transistor area (I).

Figure 9:
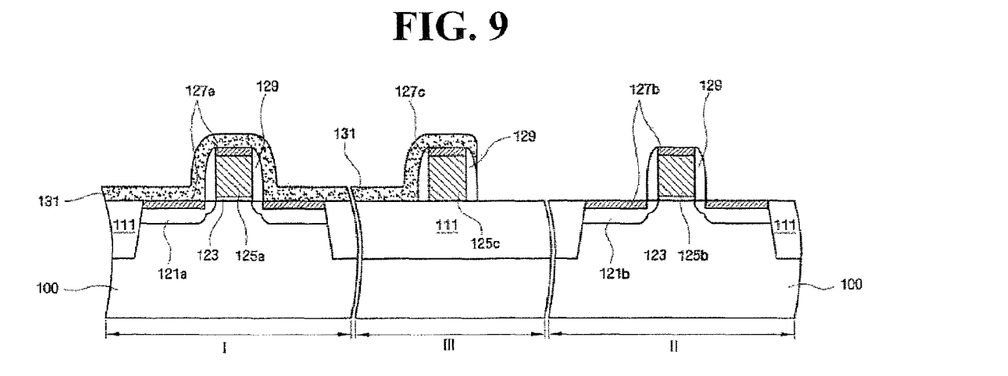

With reference to FIG. 9, the layer for a first stress film 131a is etched using the first photoresist pattern 201 as an etching mask. The etching may be performed using a dry etching process and/or a wet etching process. As shown in FIG. 9, the first stress film (see reference numeral 131) is formed in the NMOS transistor area (I) and the layer for a first stress film 131a is removed from the PMOS transistor area (II) resulting from the etching. The first stress film (see reference numeral 131) is formed in the interface area (III) so that the first stress film overlaps a portion of the gate electrode 125c. Subsequently, an ashing process or a strip process is performed to remove the first photoresist pattern 201.

Figure 10:
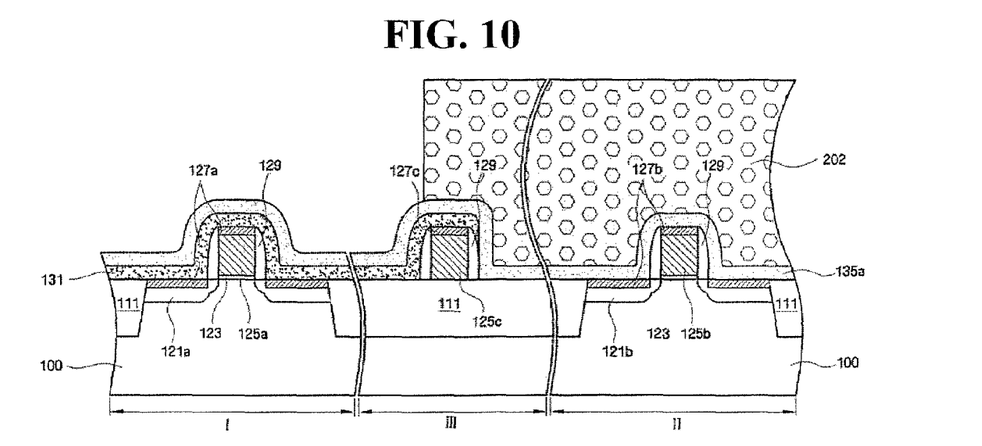

With reference to FIG. 10, a layer for a second stress film 135a is formed on the front (exposed) side of the resulting structure of FIG. 9. The layer for a second stress film 135a may be, for example, a compressive stress film. The layer for a second stress film 135a may be formed of SiN, SiON, SiBN, SiC, SiC:H, SiCOH, SiCN and/or $SiO_2$, like the first stress film 131a. The process that is used to form the layer for a second stress film 135a may be the same as the layer for a first stress film 131a. However, the deposition condition of the layer for a second stress film 135a and/or a composition ratio of substances constituting the film may be controlled so that the layer for a second stress film 135a has different stress from that of the first stress film. For example, the stress of the layer for a second stress film 135a may be about −0.01 to about −5 GPa.

The layer for a second stress film 135a may have a thickness in the range of about 1 to about 1,000 Å. In some embodiments, the thickness of the layer for a second stress film 135a may be substantially the same as the thickness of the first stress film 131.

Subsequently, a second photoresist pattern 202 is formed on the layer for a second stress film 135a. The second photoresist pattern 202 can cover the entire surface of the PMOS transistor area (II) while the NMOS transistor area (II) is exposed. Additionally, the second photoresist pattern 202 may be formed to cover a portion of the gate electrode 125c of the interface area (III), and in some embodiments the entire gate electrode, so as to provide the process margin, that is, to completely cover the entire PMOS transistor area (II).

Figure 11:
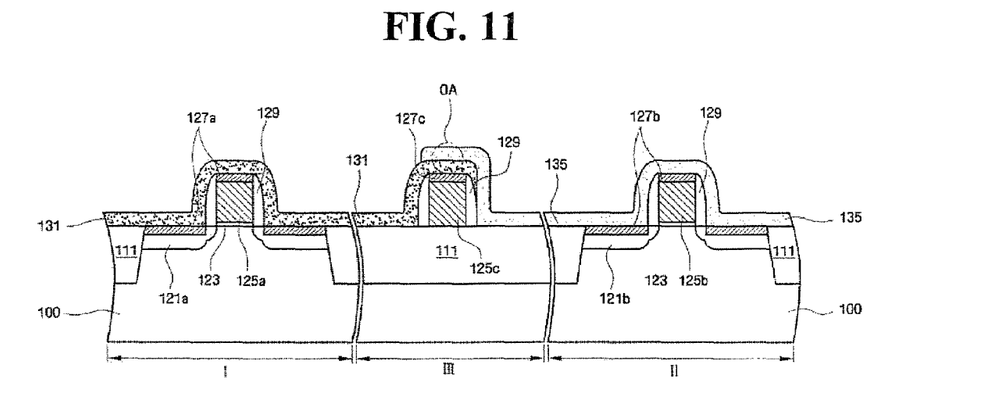

With reference to FIG. 11, the layer for a second stress film 135a is etched using the second photoresist pattern 202 as an etching mask. The etching of the layer for a second stress film 135a may be performed using a dry etching process and/or a wet etching process. As shown in FIG. 11, the second stress film (see reference numeral 135) is formed in the PMOS transistor area (II) and the layer for a second stress film 135a is removed from the NMOS transistor area (I) resulting from the etching. The second stress film (see reference numeral 135) is formed in the interface area (III) so that the second stress film overlaps a portion of the gate electrode 121c. Accordingly, the interface area (III) may include an overlapping area (OA) where the first stress film 131 and the second stress film 135 are layered on the gate electrode 121c so as to overlap each other.

Figure 12:
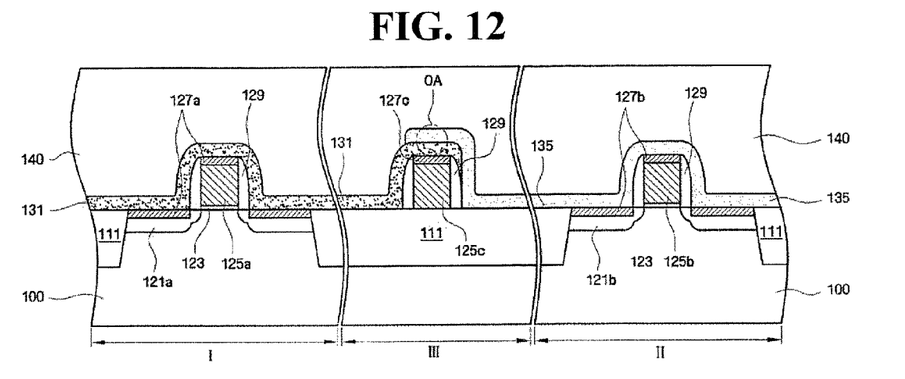

With reference to FIG. 12, the first interlayer insulating film 140 is formed on the resulting structure of FIG. 11. The first interlayer insulating film 140 may be formed of, for example, TEOS (tetra ethyl ortho silicate), $O_3$-TEOS, $SiO_2$, SiON and/or SiOC. For example, the formation may be performed using processes such as CVD and/or spin coating.

Figure 13:
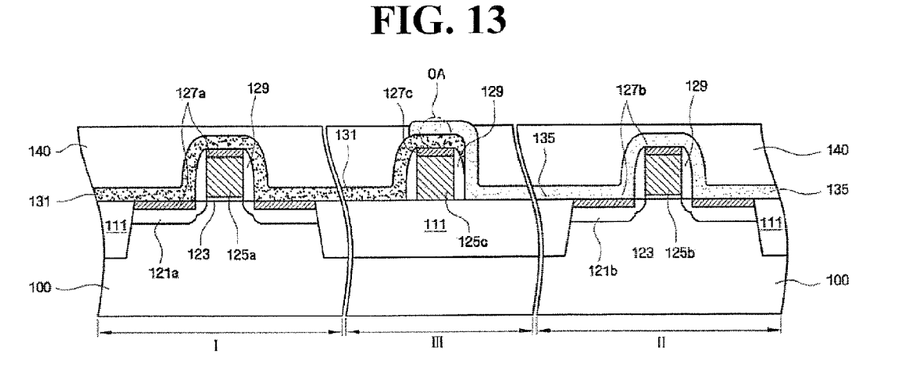

With reference to FIG. 13, the planarization process may be performed so that the second stress film 135 of the third gate electrode 125c in the interface area (III) is planarized. The planarization may be, for example, a CMP (chemical mechanical polishing) process and/or an etch back process. In the case of when the CMP process is performed, slurry where polishing selectivity of the second stress film 135 to the first interlayer insulating film 140 is high may be used. In the case of when the etch back process is performed, the etchant where etching selectivity of the second stress film 135 to the first interlayer insulating film 140 is high may be used. The CMP process and/or the etch back process may be excessively performed so as to expose the second stress film 135.

The CMP process and/or the etch back process may be performed using the second stress film 135 of the interface area (III) as a process stopper. However, the process stopper is not limited to the above-mentioned example. The CMP process or the etch back process may be stopped using the time control and/or an end point detector (EPD).

Figure 14:
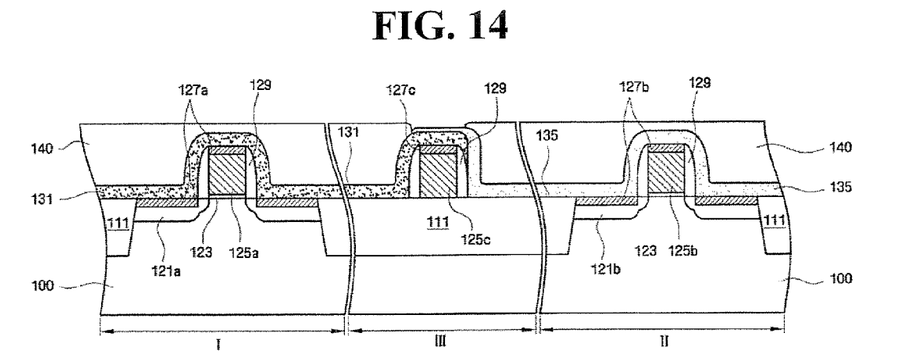

With reference to FIG. 14, the exposed second stress film 135 is at least partially removed from the interface area (III). The removal of the exposed second stress film 135 may be performed using dry etching and/or wet etching. In connection with this, the etching gas or the etchant where the etching selectivity to the second stress film 135 is higher than the etching selectivities to the first interlayer insulating film 140 may be used to selectively remove only the exposed second stress film 135. The etching selectivity may be, for example, about 20:1 or more.

As shown in FIG. 14, the second stress film 135 that is exposed by the dry etching process or the wet etching process is partially removed. The degree of removal of the second stress film 135 may depend on the degree of etching. The degree of etching may be controlled using the time control and/or the end point detector.

In the case of when the second stress film 135 is partially etched, the thickness (Dc) of the second stress film 135 in the interface area (III) may be smaller than the thickness (Db) of the second stress film 135 in the second transistor area. As a result, the level of the area where the first stress film 131 and the second stress film 135 partially overlap, that is, the second stress film 135 on the third gate electrode 125c, may be substantially similar to the level of the first stress film 131 provided on the gate electrode 125a of the first transistor area (I), or the level of the second stress film 135 provided on the gate electrode 125b of the second transistor area (II). The lateral etching may be performed during the etching of the second stress film 135.

Figure 15:
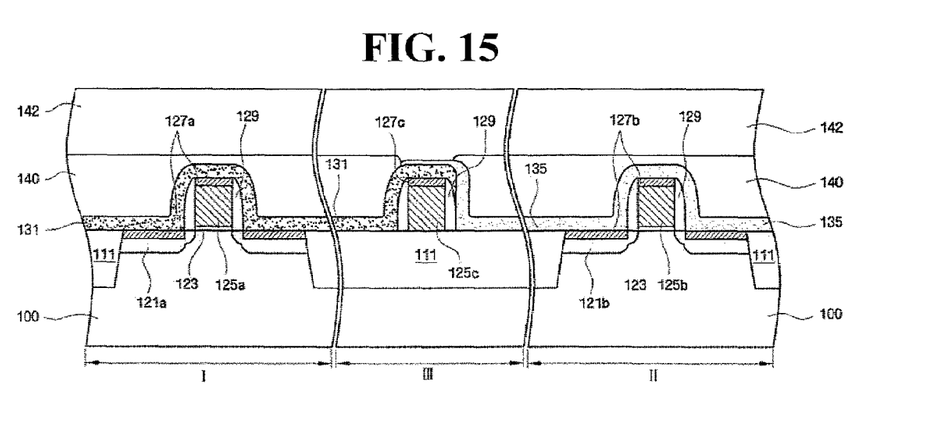

As shown in FIG. 15, the second interlayer insulating film 142 is formed on the first interlayer insulating film 140. Subsequently, the planarization is performed using the CMP etc. Like the first interlayer insulating film 140, the second interlayer insulating film 142 may be formed of, for example, TEOS (tetra ethyl ortho silicate), $O_3$-TEOS, $SiO_2$, SiON and/or SiOC. For example, the formation may be performed using a process such as CVD and/or spin coating. The second interlayer insulating film 142 may be formed of the same substance as the first interlayer insulating film 140.

The upper (exposed) side of the first interlayer insulating film 140 that is provided by forming the second interlayer insulating film 142, that is, the interface between the first interlayer insulating film 140 and the second interlayer insulating film 142 can be substantially flat, and may have about the same level as the highest upper side of the upper sides of the first stress film 131 and the second stress film 135 provided on the upper sides of the gate electrodes 125a, 125b, and 125c.

Figure 16:
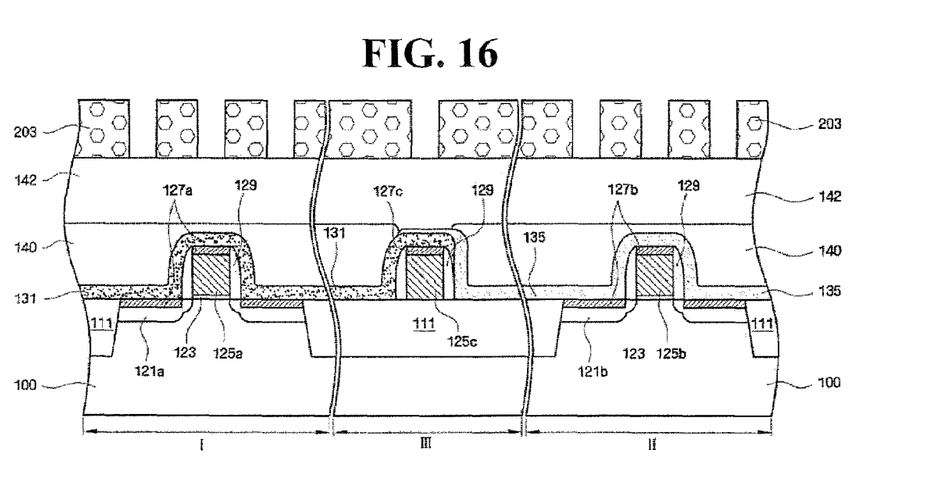
Figure 17:
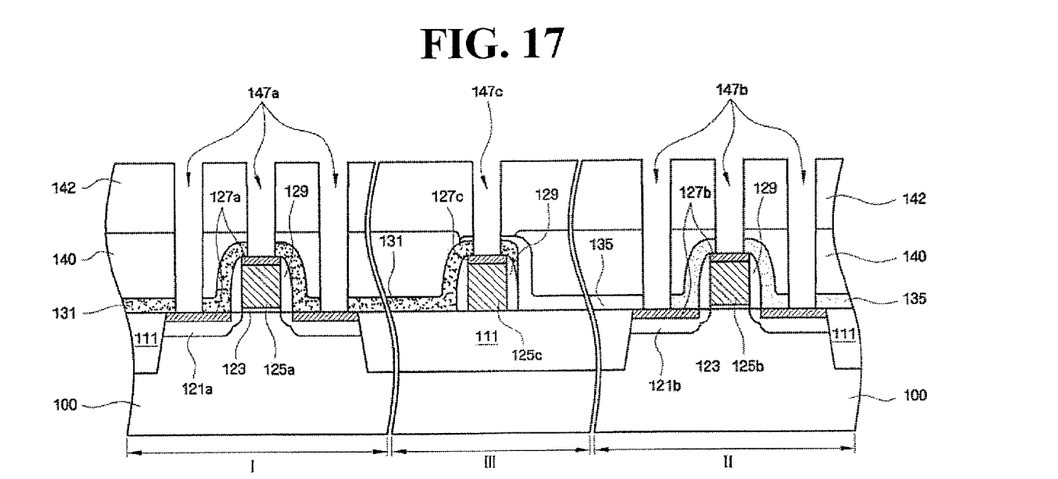

With reference to FIGS. 16 and 17, the interlayer insulating films 140 and 142 are patterned to form contact holes 147a, 147b, and 147c in the NMOS transistor area (I), the PMOS transistor area (II), and the interface area (III). The patterning of the first and the second interlayer insulating films 140 and 142 may be performed using, for example, a photolithography process by means of a photoresist pattern. The etching may be performed using the dry etching process and/or the wet etching process. In some embodiments, the dry etching process may be used.

The contact holes 147a, 147b, and 147c are formed to correspond to the gate electrodes 125a, 125b, and 125c and/or the source/drain areas 121a and 121b. The first contact hole 147a may be formed through the first and the second interlayer insulating films 140 and 142 and the first stress film 131, and the third contact hole 147c may be formed through the first and the second interlayer insulating films 140 and 142. Since the third contact hole 147c is formed through the overlapping area (OA) where the first stress film 131 and the second stress film 135 overlap, the third contact hole may be formed through the thinner second stress film 135 in comparison with the second transistor area (II).

In order to form contacts of a device having dual stress films, the contact holes 147a, 147b, and 147c that are formed through the stress films 131 and 135 should expose the silicide films 127a, 127b, and 127c. In some methods of producing semiconductor devices according to some embodiments of the present invention, the level of the second stress film 135 provided on the third gate electrode 125c in the interface area (III) may be substantially similar to the level of the first stress film 131 provided on the gate electrode 125a in the first transistor area (I) or the level of the second stress film 135 provided on the gate electrode 125b in the second transistor area (II). In other words, the thicknesses of the stress films to be removed during the formation of all the contact holes may be substantially the same as each other.

As a result, etching ending points may be controlled to be similar when the contact holes are formed in the NMOS transistor area (I), the PMOS transistor area (II), and the interface area (III). When the contact holes 147a, 147b, and 147c are simultaneously formed in all the areas, even if the etching ending point is set to correspond to the second stress film 135 on the third gate electrode 125c of the interface area (III), the upper side of the third silicide film 127c included in the third gate electrode 125c may be stably exposed. Additionally, since the contact hole 147c that is formed through the above-mentioned process is formed through the overlapping area (OA) where the first stress film 131 and the second stress film 135 overlap to desirably transfer electric signal, reliability and/or other characteristics of the semiconductor device may be improved. Moreover, it is possible to reduce or prevent the overetching from occurring in the NMOS transistor area (I) and the PMOS transistor area (II) having the single stress film. Additionally, it is possible to reduce or prevent the exposure of the source/drain areas 121a and 121b and the gate electrodes 125a and 125b through the contact holes 147a, 147b, and 147c resulting from the removal of the silicide films 127a and 127b due to the overetching.

A next step will be described with reference to FIG. 1A. Subsequently, the contact plugs 171, 173, and 175 are formed in the contact holes 147a, 147b, and 147c. The contact plugs 171, 173, and 175 are made of a metal substance such as W, Cu and/or Al, and/or a conductive substance such as conductive polysilicon. The contact plugs 171, 173, and 175 may be formed by means of the above-mentioned substance(s) using low pressure CVD (LPCVD), atomic layer deposition (ALD), physical vapor deposition (PVD), metal organic CVD (MOCVD), electrolytic plating and/or electroless plating. If desired, the planarization process such as CMP (chemical mechanical polishing) and/or etchback may be performed until the surface of the interlayer insulating film 140 is exposed, thereby producing the semiconductor device shown in FIG. 1A.

Figure 18:
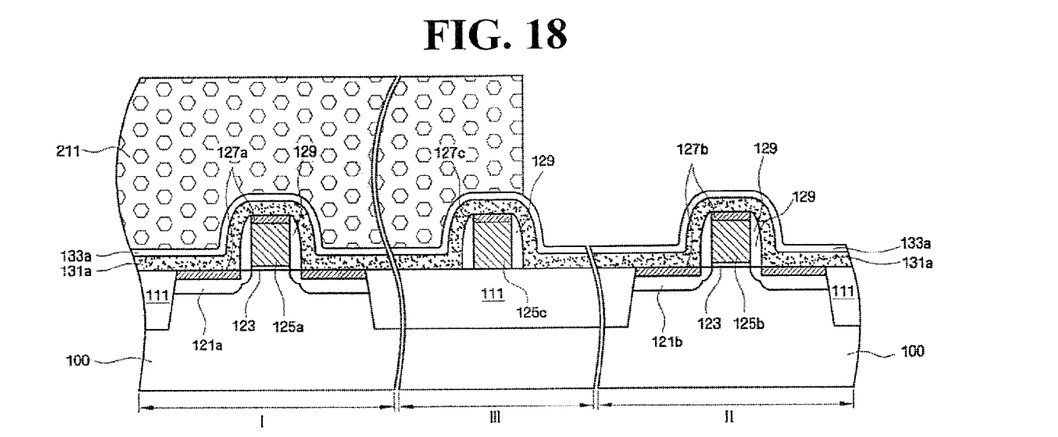
FIG. 18 is a cross-sectional view illustrating methods of producing semiconductor devices and devices so produced according to other embodiments of the present invention.

Hereinafter, a description will be given of the production of semiconductor devices according to embodiments of the present invention shown in FIG. 1B with reference to FIG. 18. In the present embodiments, a description of the intermediate structures that are the same as those of the embodiment of FIGS. 2 to 17 or are easily analogized from those of the embodiment of FIGS. 2 to 17 will be omitted, and a difference in embodiments will be mainly described.

Methods of producing semiconductor devices according to the present embodiments can be substantially the same as that of the description with reference to FIGS. 2 to 8. That is, methods of the present embodiments can be substantially the same as the methods of producing the semiconductor device shown in FIG. 1A, with the exception of the processes after the formation of the layer for a first stress film 131a on the front side of the semiconductor substrate 100 after the source/drain areas 121a and 121b and the silicide films 127a, 127b, and 127c are formed on the semiconductor substrate 100.

The methods of the embodiments of the present invention include forming the layer for an etch stop film 133a on the upper side of the layer for a first stress film 131a after forming the layer for first stress film 131a. The layer for an etch stop film 133a may be formed of a silicon oxide film such as an LTO film. Subsequently, as shown in FIG. 18, a third photoresist pattern 211 is formed on the layer for an etch stop film 133a provided on the layer for a first stress film 131a. The third photoresist pattern 211 can be substantially the same as the first photoresist pattern 201 of FIG. 8 except that the third photoresist pattern 211 is formed on the layer for an etch stop film 133a.

Subsequent processes can be substantially the same as the processes of FIGS. 9 to 17 except that the etch stop film 133 is formed on the upper side of the first stress film 131. However, in the present embodiments, since the etch stop film 133 is formed on the first stress film 131, in the case of when the first stress film 131 and the second stress film 135 have the same thickness, the total thickness of the first stress film 131 and the etch stop film 133 of the NMOS transistor area (I) may be larger than the thickness of the second stress film 135. The thickness of the first stress film 131 where the etch stop film 133 is provided may be smaller than the thickness of the second stress film 135.

Hereinafter, a description will be given of the production of semiconductor devices according to embodiments of the present invention shown in FIG. 1C. In the present embodiments, a description of the intermediate structures that are the same as those of the embodiment of FIGS. 2 to 17 or are easily analogized from those of the embodiment of FIGS. 2 to 17 will be omitted, and a difference in embodiments will be mainly described.

With reference to FIG. 14, the exposed second stress film 135 is removed in the interface area (III). In connection with this, the dry etching and/or the wet etching may be used as described above. However, the degree of removal of the second stress film 135 may depend on the degree of etching. Accordingly, the semiconductor device shown in FIG. 1A is different from the semiconductor device shown in FIG. 1C in that the second stress film 135 is wholly etched on the third gate electrode 125c. Therefore, the second stress film 135 may not overlap the third gate electrode 125c. The third contact hole 147c may be formed through the first and the second interlayer insulating films 140 and 142, and the etch stop film 133, but not through the second stress film 135.

Additionally, in modifications of the present embodiments, the etch stop film 133 may be formed on both the first stress film 131 and the second stress film 135, or the etch stop film 133 may not be formed on either film of the first stress film 131 and the second stress film 135.

In semiconductor devices and methods of producing semiconductor devices according to some embodiments of the present invention, a second stress film is partially or wholly removed from an overlapping region where a first stress film and the second stress film overlap during the formation of contact holes. Thereby, the attack to a lower structure such as an upper side of a gate electrode and upper sides of source/drain areas due to the formation of the contact holes may be reduced, and contact characteristics and reliability of the semiconductor device may be improved.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of producing a semiconductor device, the method comprising:
   forming a first stress film on a first gate electrode and first source/drain areas of a first transistor area of a semiconductor substrate and on at least a portion of a third gate electrode of an interface area between the first transistor area and a second transistor area;
   forming a second stress film on a second gate electrode and second source/drain areas of the second transistor area of the semiconductor substrate and overlapping at least a portion of the first stress film on the third gate electrode of the interface area;
   forming a first interlayer insulating film on the first stress film and the second stress film;
   planarizing the first interlayer insulating film to expose the second stress film overlapping at least a portion of the first stress film on the third gate electrode, using the second stress film as a planarizing stopping layer;
   selectively etching at least a portion of the exposed second stress film at a faster rate relative to the planarized first interlayer insulating film to thereby thin a portion of the exposed second stress film that overlaps an underlying portion of the first stress film extending opposite the third gate electrode and is recessed relative to an upper surface of the planarized first interlayer insulating layer; and
   forming a second interlayer insulating film on the first interlayer insulating film and on the thinned portion of the second stress film, so that a height of an interface between the second interlayer insulating layer and the planarized first interlayer insulating layer relative to the semiconductor substrate is greater than a height of an interface between the second interlayer insulating layer and the thinned portion of the second stress film relative to the semiconductor substrate.

2. The method of claim 1, wherein the planarizing of the first interlayer insulating film is performed using a CMP and/or etch back process.

3. The method of claim 1, wherein the removing of the exposed second stress film is performed using dry etching and/or wet etching.

4. The method of claim 1 further comprising:
   wherein forming a first stress film is followed by forming an etch stop film on the first stress film;
   wherein forming a first stress film includes forming a precursor layer for the first stress film and removing the precursor layer for the first stress film in the interface area and in the second transistor area; and
   wherein forming an etch stop film includes forming a precursor layer for the etch stop film and removing the precursor layer for the etch stop film.

5. The method of claim 4, wherein the etch stop film is an LTO film.

6. The method of claim 1, wherein:
   the first transistor area includes an NMOS transistor; and
   the second transistor area includes a PMOS transistor.

7. The method of claim 1, wherein:
   the first stress film has tensile stress of about 0.01 to about 5 GPa; and
   the second stress film has compressive stress of about −0.01 to about −5 GPa.

8. The method of claim 1, further comprising forming silicide films on the first, the second, and the third gate electrodes, and on the first and the second source/drain areas.

9. The method of claim 1, wherein the first stress film and the second stress film comprise SiN, SiON, SiBN, SiC, SiC:H, SiCOH, SiCN and/or $SiO_2$.

10. The method of claim 1, wherein the first and the second interlayer insulating films comprise $O_3$-TEOS, USG, PSG, BSG, BPSG, FSG, SOG and/or TOSZ.

11. The method of claim 1, further comprising:
    patterning the first and the second interlayer insulating films to form a plurality of contact holes through which the first, the second, and the third gate electrodes and the first and the second source/drain areas are exposed; and
    forming a contact plug in a respective contact hole.

* * * * *